(12) United States Patent
Bartelt-Muszynski et al.

(10) Patent No.: US 8,936,224 B2
(45) Date of Patent: Jan. 20, 2015

(54) MOUNTING SYSTEM, ESPECIALLY FOR SOLAR MODULES

(75) Inventors: Sven Bartelt-Muszynski, Schwedt (DE); Gido Genschorek, Schwedt (DE)

(73) Assignee: Sapa Holding GmbH, Offenburg (DE)

( * ) Notice: Subject to any disclaimer, the term of this patent is extended or adjusted under 35 U.S.C. 154(b) by 997 days.

(21) Appl. No.: 12/304,836

(22) PCT Filed: Jun. 11, 2007

(86) PCT No.: PCT/DE2007/001048
§ 371 (c)(1),
(2), (4) Date: Dec. 15, 2008

(87) PCT Pub. No.: WO2007/143983
PCT Pub. Date: Dec. 21, 2007

(65) Prior Publication Data
US 2009/0166494 A1 Jul. 2, 2009

(30) Foreign Application Priority Data

Jun. 15, 2006 (DE) ...................... 20 2006 009 871 U
Jun. 7, 2007 (DE) ...................... 20 2007 007 976 U

(51) Int. Cl.
*E04G 3/22* (2006.01)
*E04D 13/18* (2014.01)
(Continued)

(52) U.S. Cl.
CPC ........... *H01L 31/0422* (2013.01); *F24J 2/5207* (2013.01); *F24J 2/5247* (2013.01);
(Continued)

(58) Field of Classification Search
USPC .............. 248/226.11, 237, 205.1, 205.6, 208, 248/229.16, 229.26, 228.7, 231.21; 136/230, 251, 244; 52/173.3, 582.1, 52/584.1, 653.1, 656.1, 654.1; 126/623, 126/704
See application file for complete search history.

(56) References Cited

U.S. PATENT DOCUMENTS 2,577,120 A * 12/1951 Franz .......................... 211/85.18
3,637,084 A * 1/1972 Uitz ............................ 211/105.1
(Continued)

FOREIGN PATENT DOCUMENTS

DE 3342616 A1 6/1985
DE 3422049 A1 12/1985
(Continued)

*Primary Examiner* — Christopher Garft
(74) *Attorney, Agent, or Firm* — Patent Central LLC; Stephan A. Pendorf

(57) ABSTRACT

The invention relates to a mounting system, in particular for solar modules (1), consisting of supports (2) with a closed hollow box profile (3), with connectors (4) for solar module fastening means, and connectors (5) for roof fastening means. At least the connectors (4) for the solar module fastening means are formed from longitudinal groove pairs—or longitudinal flange pairs in or on the hollow box profile (3) that are arranged at a distance from each other. The fastening means for the solar module (1) or solar modules (1) in the area of the support consist of a clamping piece with a shaped part (8), with each shaped part (8) having at least two webs (9.1, 9.2), arranged opposite each other on the shaped part (8) whereby at least one positive click connection with one of the groove pair—or flange pairs can be made by means of the ends remote from the shaped part (8), and the shaped part (8) has at least one bore hole (11) for the insertion of a fastening bolt (14). The fastening can be carried out as a click-in and/or click-on system.

14 Claims, 3 Drawing Sheets

Sideview A-A Section

Figure 1:
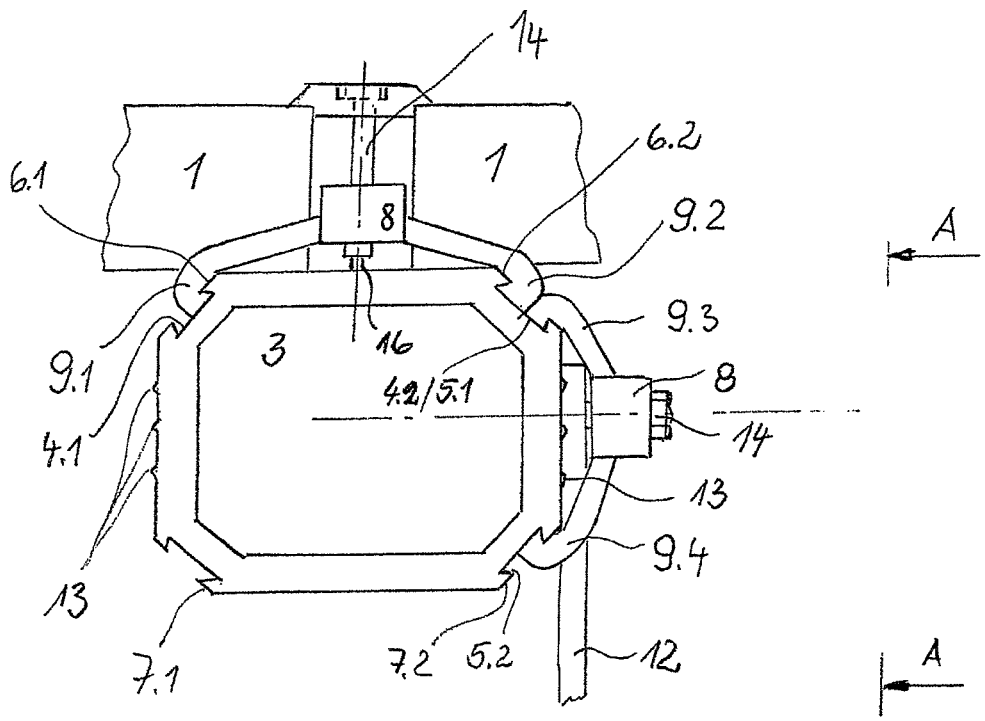
Figure 1:
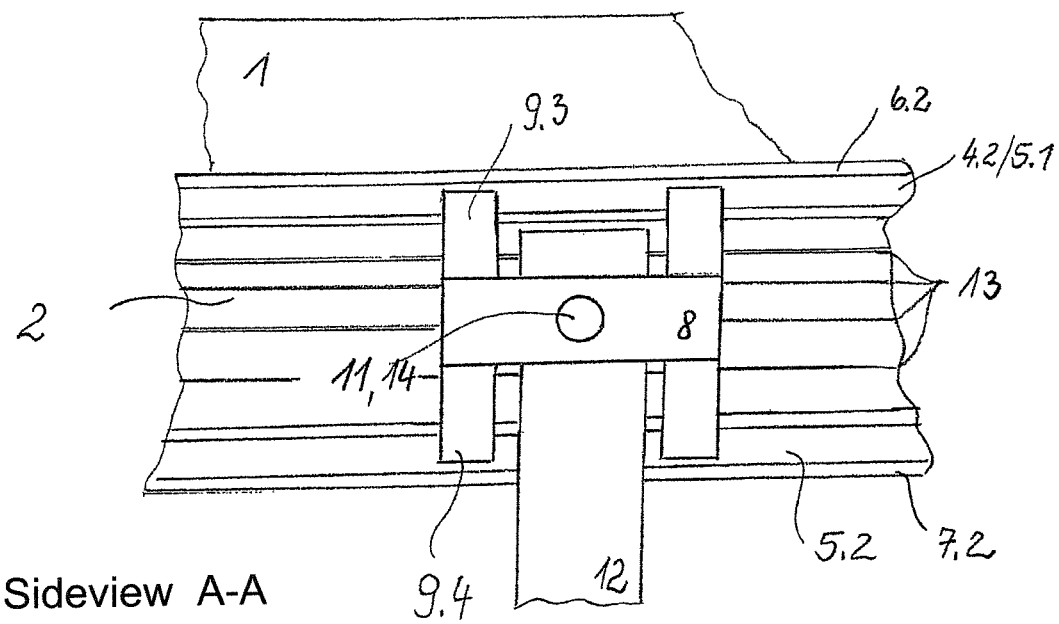

(51) Int. Cl.
*H01L 31/042* (2014.01)
*F24J 2/52* (2006.01)
*F24J 2/46* (2006.01)

(52) U.S. Cl.
CPC ............... *F24J 2/5258* (2013.01); *F24J 2/526* (2013.01); *F24J 2002/4661* (2013.01); *F24J 2002/4665* (2013.01); *F24J 2002/467* (2013.01); *F24J 2002/5215* (2013.01); *Y02B 10/12* (2013.01); *Y02B 10/20* (2013.01); *Y02E 10/47* (2013.01); *Y02E 10/50* (2013.01)
USPC .................. 248/237; 248/226.11; 248/205.1; 248/205.6; 248/208; 248/229.16; 248/229.26; 248/228.7; 248/231.21; 136/230; 136/251; 136/244; 126/623; 126/704; 52/173.3; 52/582.1; 52/584.1; 52/653.1; 52/654.1

(56) References Cited

U.S. PATENT DOCUMENTS

| | | | |
|---|---|---|---|
| 4,583,359 A | | 4/1986 | Staeger |
| D330,774 S | * | 11/1992 | Klaric .......................... D25/125 |
| 5,740,996 A | * | 4/1998 | Genschorek ................. 248/237 |
| 5,864,997 A | * | 2/1999 | Kelly .......................... 52/282.2 |
| 6,414,237 B1 | | 7/2002 | Boer |
| 7,946,082 B2 | * | 5/2011 | Ohkoshi et al. .............. 52/173.3 |
| 2008/0053009 A1 | * | 3/2008 | Plaisted et al. ............... 52/173.3 |
| 2008/0210221 A1 | * | 9/2008 | Genschorek .................. 126/704 |
| 2009/0019796 A1 | * | 1/2009 | Liebendorfer ............... 52/173.3 |
| 2009/0134297 A1 | * | 5/2009 | Beck ........................... 248/237 |
| 2010/0083954 A1 | * | 4/2010 | Bartelt-Muszynski ....... 126/704 |

FOREIGN PATENT DOCUMENTS

| | | |
|---|---|---|
| DE | 3928486 A1 | 3/1990 |
| DE | 20117399 U1 | 2/2002 |
| DE | 10132557 A1 | 6/2002 |
| DE | 10152354 C1 | 5/2003 |
| DE | 102004044103 B4 | 4/2005 |
| DE | 202005001469 U1 | 4/2005 |
| DE | 202005019924 U1 | 3/2006 |
| DE | 102005000129 A1 | 3/2007 |
| EP | 1496550 A2 | 1/2005 |
| EP | 1767793 A2 | 3/2007 |
| FR | 2668528 A1 | 4/1992 |
| JP | 10122125 A | 5/1998 |

* cited by examiner

Sideview A-A
Section

MOUNTING SYSTEM, ESPECIALLY FOR SOLAR MODULES

The invention relates to a mounting system for plate-shaped bodies, especially solar modules, on roofs or on walls of buildings wherein a supporting frame of mounting profiles is connected with a supporting structure of the roof, for example by way of roof hooks, or with the wall and the solar modules are fastened thereto.

After developments in mounting systems for the fastening of solar modules especially on roofs and other preferably inclined large surfaces largely led to a lowering of the installation cost and permitted the mounting of modules with different thickness dimensions in the frame region, one again poses the question for the optimal use of the fastening properties of the mounting profiles used.

It was thereby surprisingly discovered that the mounting profiles used of aluminium or aluminium alloys are normally "open" profiles, which means a plurality of webs are combined into a truss or deformations of profile surfaces reach into the interior of hollow profiles so that corresponding fastening means can engage therein or grab behind profile webs and generate in this manner a counterbearing for the fixation of the solar module frames on the one hand and of roof hooks on the other hand.

They are thereby often inwardly offset profiles (DE 34 23 227 A1), L-profiles with additional supporting surfaces (DE 195 35 104 A1), combinations of U-profiles (DE 101 52 354 C1) or pure special profiles (DE 101 32 557 A1, DE 10 2005 001 654 B3).

Such profiles have significant disadvantages. With respect to their fastening properties, they often fall behind classical box profiles. The legs or webs are easily bent upon improper loading, for example when the installer supports himself on the profile. During transport, such special profiles are hard to bundle and the manufacturing cost is definitely also higher than with simple profiles.

It is an object of the invention to provide a closed profile with optimal fastening properties which includes the achieved advances for a rational mounting on inclined roofs or surfaces.

This object is achieved with the features of claim 1, preferred embodiments are the subject of the dependent claims.

The mounting system in accordance with the invention especially for solar modules consists of supports with a hollow box girder profile with connectors for solar module fastening means and connectors for roof fastenings means, whereby at least the connectors for the solar module fastening means are formed of spaced apart longitudinal groove or longitudinal flange pairs within or on the box girder profile and the fastening means for a solar module or solar modules consists in the support region of a clamping member with a shaped part, whereby each shaped part includes at least two opposing webs positioned on the shaped part through which an at least positive click together connection with a groove or flange pairing is achievable at their ends remote from the shaped part and the shaped part has at least one bore for receiving a fastening means, preferably a bolt.

The mounting system thereby provides two variants of click-together connections:
- Clicking or click-on connection whereby a temporary widening of the flange spacing is achieved (click-on-system), and
- click into connection whereby a temporary movement of the webs of the shaped part towards one another occurs (click-in-system).

A movement of the shaped part in direction of the support axis is prevented by this positive connection. Of course, the positive connection can also be paired with a frictional connection with the corresponding construction of the flange/groove In the click-on system, the connections for the solar module fastening means are constructed as a spaced apart continuous longitudinal groove pair or longitudinal flange pair in or on the support profile and the opposing webs positioned on the shaped part engage with their ends remote from the shaped part respectively into one longitudinal groove of the longitudinal pair or over a longitudinal flange of a longitudinal flange pair of the support.

In the click-in system, the connections for the solar module fastening means are constructed as a spaced apart parallel and continuous and externally inwardly offset longitudinal flange pair on or in the support profile and the opposing webs positioned on the shaped part grip, with their ends remote from the shaped part into the gap formed by the longitudinal flange pair by clicking in. In a special embodiment of this system, the longitudinal web pair is formed by a groove in the support profile with outwardly narrowed groove width.

In a preferred embodiment, the connections for the roof fastening are constructed analogously.

The longitudinal grooves or longitudinal flanges can thereby be used with corresponding orientation for the click-on or click-in connection of clamping parts of the roof fastening and the solar module fastening respectively. This is a further advantage.

In contrast to conventional profiles, the support profile remains closed as a hollow chamber, preferably inwardly also in the box girder profile. This means that the longitudinal grooves are positioned in the profile wall, which therefor must of course have a corresponding thickness. A material reduction compared to profiles of the art of 30 to 40% is achievable thereby at the same strength.

For a support profile with a rectangular or square cross-section, it is provided that the longitudinal grooves or the flanges for the click-on system are respectively located on or in a profile surface and in the region of the two lateral edges, or on or in opposing profile surfaces respectively at the lateral edges or on or in adjacent profile surfaces. A further preferred embodiment provides that the support profile has a hexagonal or octagonal cross-section, whereby in comparison to a rectangular or square profile the edges on top or on top and underneath are formed as edge surfaces. The length of the edge surfaces should thereby be shorter than that of the remaining rectangular or square profile lengths.

The longitudinal grooves or flanges can thereby be positioned on or in the edge surfaces, preferably one longitudinal groove in or on each edge surface, preferably formed on both sides as a dovetail track. The longitudinal groove hereby positively lends itself to the clicking on or clicking in of clamping parts of the roof fasteners and the solar module fasteners.

When the longitudinal groove is positioned in the edge surfaces, it is possible to strengthen the profile cross-section in the region of the edge surfaces by simply increasing the profile thickness. Larger groove depths can thereby be achieved even with thin-walled box profiles.

The space created by flattening the edges can be used by the fastening means engaging into the grooves without them surpassing the outer profile dimensions, for example upon fastening of the solar module from above. The profiles can thereby be laterally directly adjacent to other structural parts.

The bore provided in the shaped part, preferably a threaded bore, provides for the fastening of the frame of the solar module or of the roof hook, depending on whether the clamping part was clicked onto or into the support from above or from the side.

In the click-in system, when the inner spacing of the flanges and the open groove width of the offset longitudinal flange pair or the outer free groove width are dimensioned such that the installed fastening bolt prevents a loosening of the clicked-in webs from the at least positive connection by pushing together of the webs, an automatic detachment of the system is prevented.

The shaped part and webs of the clamping part can also be used for the generation of a connection to the support, for example of a further support for the extension of the first support. The fastening bolt that can be screwed into the shaped part is therefor provided with a piercing end, with which it preferably penetrates through the support profile and into a support profile connecting part slit into the support profile, thereby fixing it. A new truss is pushed onto the protruding support profile connecting part and fastened in the same manner. This arrangement can be undone. It is however also possible to achieve deformation of the two supports with the support profile connecting part during the clamping so that a positive locking is achieved.

Exemplary embodiments are illustrated in the drawing.

It is shown in:

FIG. 1: a box profile in the click-on embodiment, and

Figure 2:
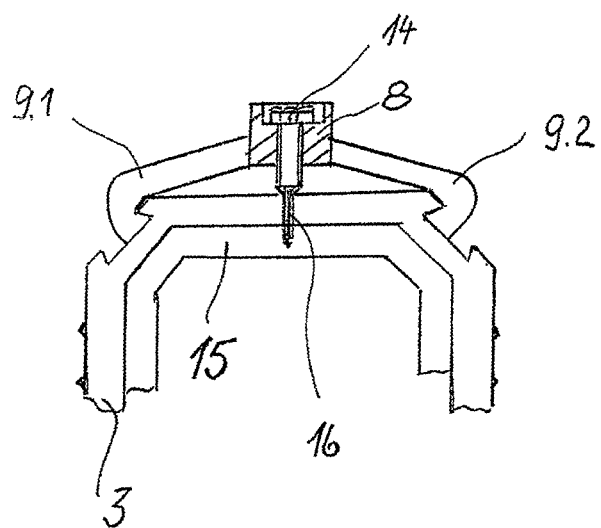

FIG. 2: an end connection for the support.

Figure 3:
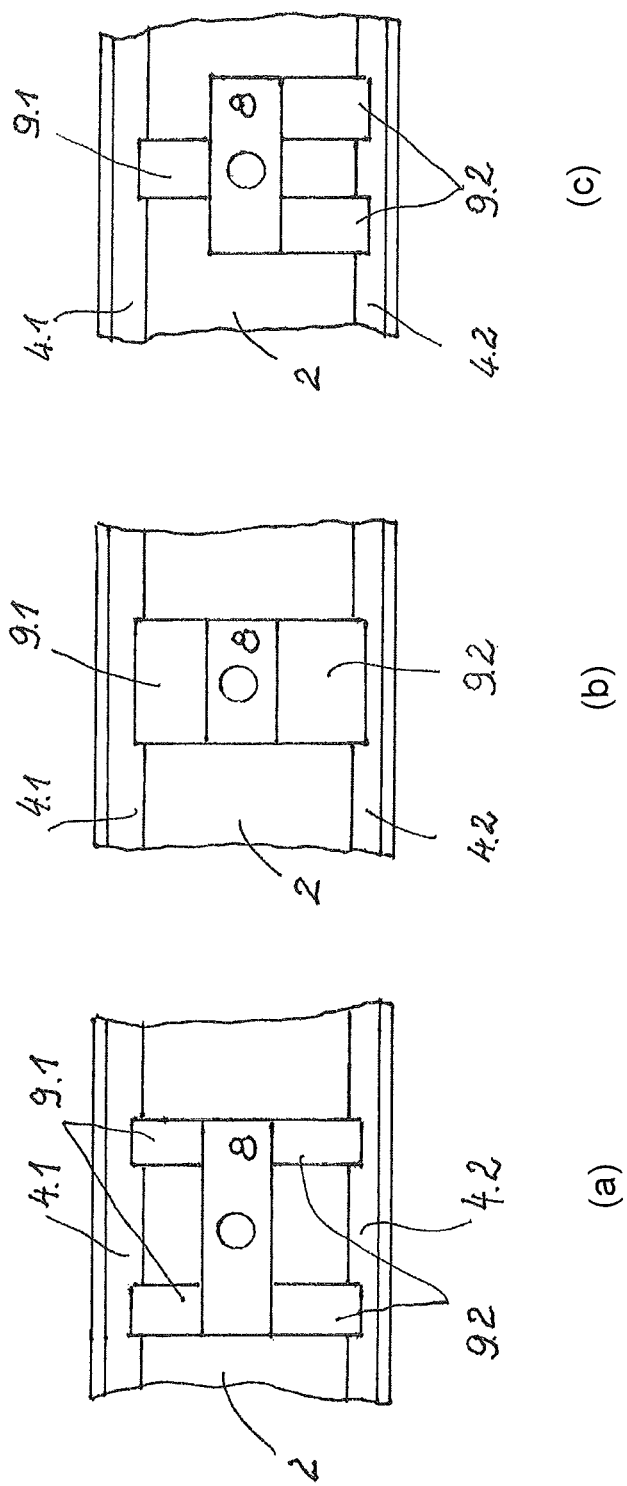

FIG. 3(*a*)-(*c*): shows the two/two (as in FIG. 1), one/one, and one/two variations of the webs.

FIG. 1 shows a click-on system support 2 with support profile 3 in the form of a square profile with flattened edges which are referred to as edge surfaces 6.1, 6.2 at the top and 7.1 and 7.2 at the bottom. A longitudinal groove 4, 5 in longitudinal direction of the support is positioned centered in each edge surface and formed on both sides as a dovetail track. The square profile is closed and therefore has optimal strength properties. The manufacture including the groove 4, 5 can be technologically easily achieved by extrusion. Manageable support lengths can be achieved by cutting. Transport is economical because of the optimal stackability. The profile furthermore has no elevated bosses which are deformable by being stepped on. Already installed supports can thereby be used by the installers as stepping surfaces during installation.

Clamping parts are clipped onto the support profile 3 for the fastening of the support 2 onto a roof by way of roof hooks 12 and for the fastening of the solar module 1. The clamping parts consist of a shaped part 8 which is provided with opposing webs 9 the remote ends of which are spaced from the shaped part 8 and engage the respective longitudinal groove 4, 5 positively and/or non-positively.

In the illustrated embodiment, the shaped parts 8 mounted at the top are respectively provided on each side with a web 9.1, 9.2 for the fastening of the solar module and the shaped parts 8 located at the side for the roof hook fastening are respectively provided with a pair of webs 9 which are spaced from one another. The ends of the webs are positively and/or non-positively anchored in the longitudinal groove 4.2/5.1. The longitudinal groove 4.2/5.1 is here a groove and forms part of the longitudinal groove pair 4.1-4.2 and 5.1-5.2. The webs 9.1 and 9.4 on the other side of the shaped part 8 engage the longitudinal groove 4.1 or 4.2 positively and/or non-positively.

The use of pair wise spaced apart webs 9 (in total 8 webs) is important especially for the roof hook fastening. The connecting part of the roof hook can thereby be slid between the webs 9 of one side into the slot between the shaped part 8 and the support 2 and pressed against the support 2 by a fastening bolt 14 in the shaped part 8. The ends of the web pairs 9.3, 9.4 thereby claw into the longitudinal grooves 4.2/5.1 and 5.2

Providing a longitudinal toothing 13 on the support 2, allows the connecting part of the roof hook 12, which in the fastening region includes analogous recesses or protrusions, to be connected with the support 2 by a positive locking in addition to the non-positive connection. A displacement orthogonal to the roof is thereby prevented. The longitudinal toothing 13 of the support can be basic (single dentation), when the connecting part of the roof hook 12 has several analogous recesses or protrusions with respect to the height. Of course this is also possible in the reverse where both parts can have several paired protrusions and recesses. The longitudinal toothing 13 of the support 2 is again advantageous when manufactured by extrusion, since it is easily manufactured during the extruding of the support 2. A longitudinal toothing 13 as used herein can be in the form of a groove as well as a protruding tooth in the support profile 3.

As is apparent, the webs 9 clicked into the edge surfaces 6.1, 6.2, 7.2 do not protrude past the outer profile limits, so that laterally a visually flat support 2 is provided and the installation of any further lateral connection is not impeded. This is also a further significant advantage of the installation system provided.

The shaped parts 8 have a threaded bore 11 oriented in the direction of the support profile 3 through which the fastening of the solar module 1 or the roof hook 12 can be achieved by way of a fastening bolt. Instead of a thread/bolt connection, other known connecting elements can also be used for the solar module fastening.

During the solar module fastening, the shaped parts 8 are moved somewhat upward between the solar module frames whereby the webs 9 also rigidly hook into the longitudinal groove 4.1, 4.2/5.1 and the solar modules 1 are pushed with their frame onto the support profile 3. If for tightening of the fastening bolt 14, the bolt also has a piercing extension 16, an additional fixation in the support profile 3 through penetration into or therethrough is also possible.

This illustrated embodiment shows that apart from the already mentioned advantages of the profile, all installation work can be done from above and only with few handholds. This is a further advantage of the solution.

FIG. 2 illustrates an end connection for the support 2 with the support profile 3 using a shaped part 8 with webs 9. The shaped part 8 with its webs 9.1, 9.2 is clipped onto the support profile 3. A support profile connecting part 15 is pushed into the support profile 3.

The fastening bolt 14 screwed into the shaped part 8 includes a piercing extension 16 with which it penetrates through the support profile 3 and penetrates at least into the inserted support profile connecting part 15 to fix the latter in place.

A further support 2 can now be pushed onto the support profile connecting part 15 and connected therewith by way of a further clamping part with shaped part 8 in an analogous manner.

These actions can also be carried out from above and do not require much effort. The fastening bolt is sunk into the shaped part 8 so that the support extension does not interfere in any way with the other installation steps.

FIG. 3(*a*) shows the mounting system wherein the shaped part (8) has on each side two spaced apart elastic claws (9.1, 9.2). FIG. 3(*b*) shows the mounting system wherein the shaped part (8) has on each side one spaced apart elastic claw (9.1, 9.2). FIG. 3(*c*) shows the mounting system wherein the shaped part (8) has one elastic claw (9.1) on one side and on the other side two elastic claws (9.2).

It can be said without exaggeration that with the proposed profile variant on the basis of a hollow box profile with click-in clamping parts the step away from cost intensive special profiles and towards a simple profile was executed consequently and effectively. The installation is optimally realizable on the roof, since the essential steps are achieved with the clicking on or clicking in of the clamping part, which was previously equipped with a fastening bolt and optionally a module holder, and the tightening of the fastening bolt.

LIST OF REFERENCES

1 Solar module
2 Support
3 Support profile closed
4 Connectors for solar fastening means
4.1 Longitudinal groove
4.2 Longitudinal groove
4.3 Longitudinal groove
5.1 Longitudinal groove pair
5.2 Longitudinal groove pair
6 Edge surface top
6.1 Edge surface left top
6.2 Edge surface right top
7 Edge surfaces bottom
7.1 Edge surfaces left bottom
7.2 Edge surfaces right bottom
8 Shaped part) clamping part
9 Webs on shaped part) clamping part
11 Bore in the shaped part) clamping part
12 Roof hook with connecting part
13 Longitudinal toothing
14 Fastening bolt
15 Support profile connection part
16 Piercing extension on fastening bolt The invention claimd is:

1. A mounting system comprising:
   girders, and
   claw-type solar module fastening means for fastening solar module(s) (1) to the girders,
   wherein the girders (2) have a closed box girder profile (3) with external connectors (4) in the form of a spaced-apart of longitudinal rooves (4.1-4.2) adapted for engagement with the claw-type solar module fastening means,
   wherein the claw-type solar module fastening means comprises a shaped part (8) with elastic claws (9.1, 9.2) extending opposite each other and adapted for forming a click-on connection by temporary widening of the spacing of the ends of the elastic claws and clawing-in of at least one claw end in each respective spaced-apart longitudinal groove of the pair (4.1-4.2),
   wherein the shaped part (8) has a bore (11) adapted for receiving a fastening bolt (14) for fastening the girder (2) with the solar module (1), said bore (11) extending towards the box girder profile (3),
   wherein the spacing of the spaced-apart continuous pair of longitudinal grooves (4.1-4.2) relative to the the spacing of the ends of the elastic claws is such that the click connection is conserved during the fastening of the solar module (1), and
   wherein for connection of a roof hook (12) having a connecting part and the girder (2), the connecting part of the roof hook (12) is pushed between two adjacent elastic claws (9) and into a gap between the shaped part (8) and the box girder profile (3) when the clamping part is clicked on, and pressed against the box girder profile (3) by way of the fastening bolt (14).

2. A mounting system comprising:
   girders, and
   claw-type solar module fastening means for fastening solar module(s) (1) to the girders,
   wherein the girders (2) have a closed box girder profile (3) with external connectors (4) in the form of a spaced-apart continuous pair of longitudinal grooves (4.1-4.2) adapted for engagement with the claw-type solar module fastening means, the longitudinal grooves of the longitudinal groove pair are respectively found on or in a profile surface and at two lateral edges or respectively on or in opposingly positioned profile surfaces respectively at the lateral edges,
   wherein the claw-type solar module fastening means comprises a shaped part (8) with elastic claws (9.1, 9.2) extending opposite each other and adapted for forming a click-on connection by temporary widening of the spacing of ends of the elastic claws and clawing-in of at least one claw end in each respective spaced-apart longitudinal groove of the pair (4.1-4.2),
   wherein the shaped part (8) has a bore (11) adapted for receiving a fastening bolt (14) for fastening the girder (2) with the solar module (1), said bore (11) extending towards the box girder profile (3), and
   wherein the spacing of the spaced-apart continuous pair of longitudinal grooves (4.1-4.2) relative to the the spacing of the ends of the elastic claws is such that the click connection is conserved during the fastening of the solar module (1).

3. The mounting system according to claim 2, further comprising connectors for roof fastening, wherein the connectors for the roof fastening are constructed as a spaced apart continuous longitudinal groove pair (4.1-4.2) on the box girder profile (3) into which or over which the connectors for roof fastening (12) grip with a positive fit, which are constructed in the same manner as the clamping parts for the fastening of the solar modules.

4. The mounting system according to claim 3, wherein the longitudinal grooves or longitudinal flanges are provided both for the clicking on of clamping parts of the roof fastening and the solar module fastening.

5. The mounting system according to claim 2, wherein the box girder profile (3) is a rectangular or square box profile.

6. The mounting system according to claim 2, wherein the box girder profile (3) has a hexagonal or octagonal box cross-section.

7. The mounting system according to claim 6, wherein edge surfaces (6.1, 6.2, 7.1, 7.2) have a length, wherein the length of the edge surfaces (6.1, 6.2, 7.1, 7.2) is shorter than that of a remaining hexagonal or octagonal box cross-section profile length.

8. The mounting system according to claim 4, wherein one of the Longitudinal grooves (4) is provided in edge surfaces (6, 7) and wherein the profile cross-section is reinforced in the region of the edge surfaces (6, 7).

9. The mounting system according to claim 2, wherein the longitudinal grooves (4) are formed as double sided dovetail tracks.

10. The mounting system according to claim 2, wherein the shaped part (8) on each side has two spaced apart elastic claws (9) or on one side one elastic claw (9) and on the other side two elastic claws (9).

11. The mounting system according to claim 2, wherein the bore (11) of the shaped part (8) is a threaded bore for receiving of the fastening bolt (14) for the solar module (1) or for a connecting part of a roof hook (12) or for a box girder profile connecting part (15).

12. The mounting system according to claim 2, wherein the fastening bolt (14) has a piercing extension (16) which is dimensioned for penetrating into and/or through the box girder profile (3).

13. The mounting system according to claim 2, wherein clamping parts made of the shaped part (8) with the elastic claws (9) are used for the generation of an extension connection of girder (2) to a second girder (2'), in which a girder profile connecting part (15) is positioned in both of the girders (2, 2') to be connected and both girders (2, 2') are connected with one another by fastening bolts (14) of the clamping parts which respectively penetrate through the box girder profile (3) and at least penetrate into the girder profile connecting part (15) or press the box girder profile (3) onto the girder profile connecting part (15).

14. The mounting system according to claim 2, wherein the solar modules have frames, the shaped part (8) is moveable slightly upwards between the solar module frames, wherein the frames of the solar modules (1) are pressed onto the box girder profile (3) and a firm claw connection between the elastic claws (9.1, 9.2) and the longitudinal grooves (4.1, 4.2), is established.

* * * * *